US010665420B2

(12) United States Patent
Takasugi et al.

(10) Patent No.: US 10,665,420 B2
(45) Date of Patent: May 26, 2020

(54) CHARGED PARTICLE BEAM APPARATUS

(71) Applicant: Hitachi High-Technologies Corporation, Minato-ku, Tokyo (JP)

(72) Inventors: Yasunori Takasugi, Tokyo (JP); Satoru Yamaguchi, Tokyo (JP); Kei Sakai, Tokyo (JP); Hideki Itai, Tokyo (JP); Yoshinori Momonoi, Tokyo (JP); Toshimasa Kameda, Tokyo (JP); Yoshihiro Kimura, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 16/291,070

(22) Filed: Mar. 4, 2019

(65) Prior Publication Data

US 2019/0295815 A1  Sep. 26, 2019

(30) Foreign Application Priority Data

Mar. 26, 2018 (JP) .................. 2018-057510

(51) Int. Cl.
*H01J 37/22* (2006.01)
*H01J 37/244* (2006.01)
*H01J 37/12* (2006.01)
*H01J 37/28* (2006.01)

(52) U.S. Cl.
CPC ............ *H01J 37/222* (2013.01); *H01J 37/12* (2013.01); *H01J 37/244* (2013.01); *H01J 37/28* (2013.01); *H01J 2237/2448* (2013.01)

(58) Field of Classification Search
CPC ........ H01J 37/222; H01J 37/12; H01J 37/244; H01J 37/28; H01J 2237/2448

USPC ......................... 250/306, 307, 309, 310, 311
See application file for complete search history.

(56) References Cited

U.S. PATENT DOCUMENTS

| | | | |
|---|---|---|---|
| 3,450,833 A * | 6/1969 | Hobrough | G02B 7/32 348/326 |
| 5,493,116 A | 2/1996 | Toro-Lira et al. | |
| 6,480,285 B1 * | 11/2002 | Hill | G01B 9/04 356/492 |

(Continued)

FOREIGN PATENT DOCUMENTS

| JP | 3456999 B2 | 10/2003 |
|---|---|---|
| JP | 4943733 B2 | 5/2012 |
| JP | 5033310 B2 | 9/2012 |

*Primary Examiner* — Nicole M Ippolito
(74) *Attorney, Agent, or Firm* — Crowell & Moring LLP

(57) ABSTRACT

Provided is a charged particle beam apparatus, aiming at obtaining an image and the like focused on the sample surface and the bottom while preventing the visual field deviation occurred when focusing on the sample surface and the bottom respectively. The charged particle beam apparatus forms a first image (301), which is based on detection of the first energy charged particles, based on an irradiation with a beam whose focus is adjusted on a sample surface side, forms a second image (304) which is based on detection of second energy charged particles having a relatively higher energy than the first energy and a third image (303) which is based on the detection of the first energy charged particles, based on the irradiation with a beam whose focus is adjusted on a bottom side of a pattern included in the sample, acquires a deviation between the first image and the third image, and composes the first image and the second image so as to correct the deviation.

11 Claims, 11 Drawing Sheets

(56) References Cited

U.S. PATENT DOCUMENTS

| | | | |
|---|---|---|---|
| 7,449,690 B2 | 11/2008 | Nishiyama et al. | |
| 8,153,969 B2 | 4/2012 | Fukada et al. | |
| 2003/0053027 A1* | 3/2003 | Sarver | A61B 3/032 |
| | | | 351/216 |
| 2010/0196002 A1* | 8/2010 | Uchida | G02B 15/17 |
| | | | 396/529 |
| 2013/0284924 A1* | 10/2013 | Mizuochi | G01N 23/2206 |
| | | | 250/310 |
| 2015/0177609 A1* | 6/2015 | Mikami | G03F 1/36 |
| | | | 716/53 |
| 2018/0031982 A1* | 2/2018 | Nienhuys | G02B 5/0221 |

\* cited by examiner

[FIG. 1]
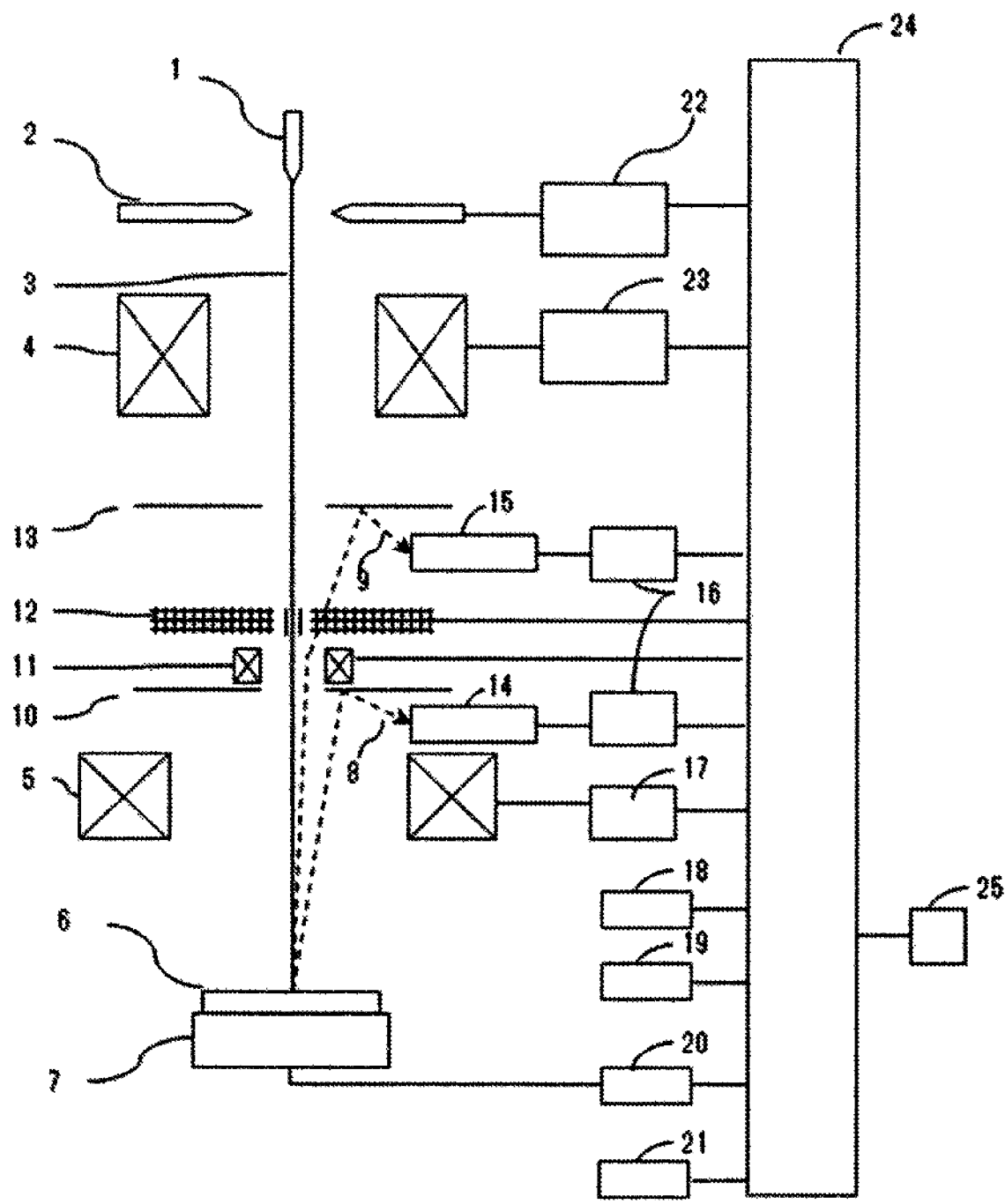

[FIG. 2]
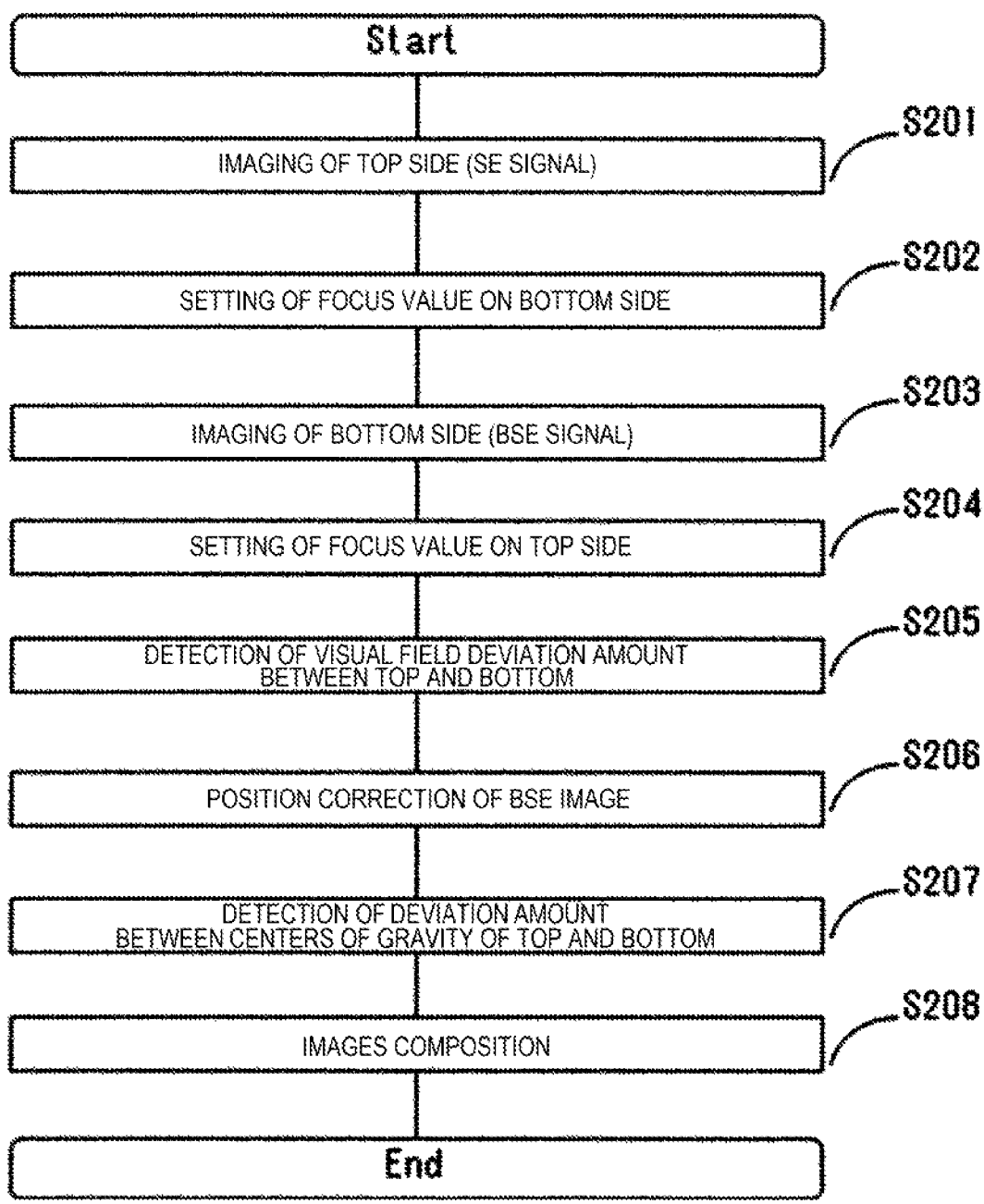

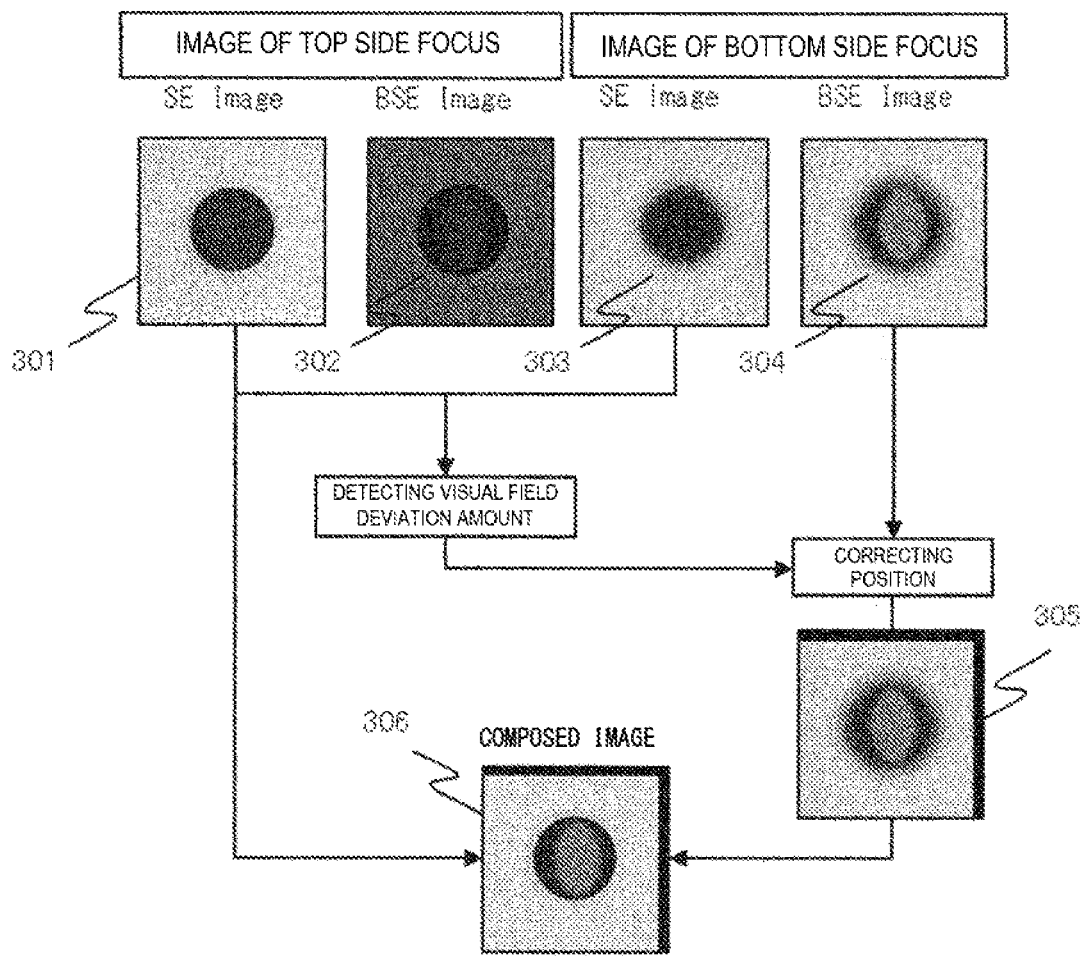

[FIG. 4]
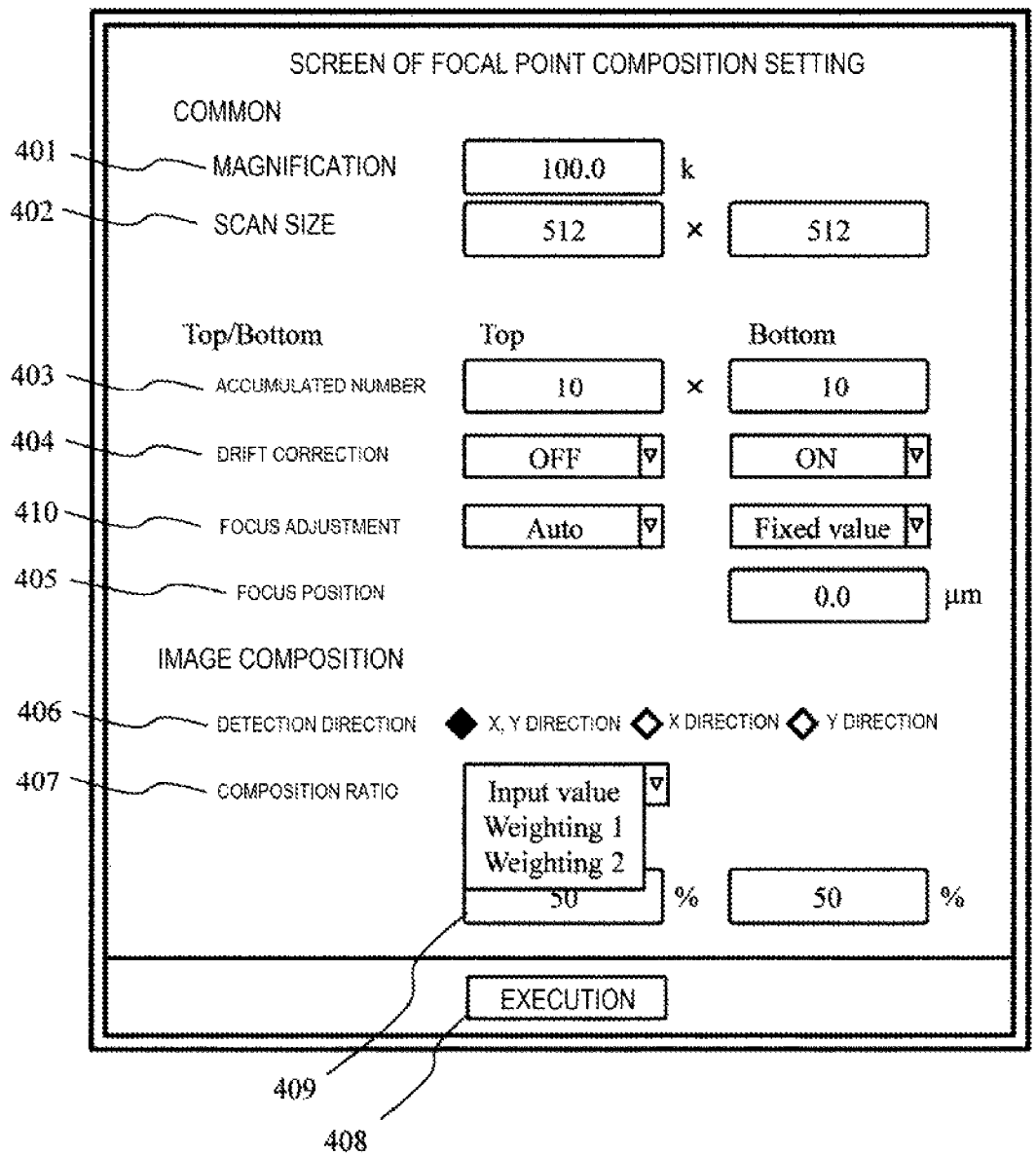

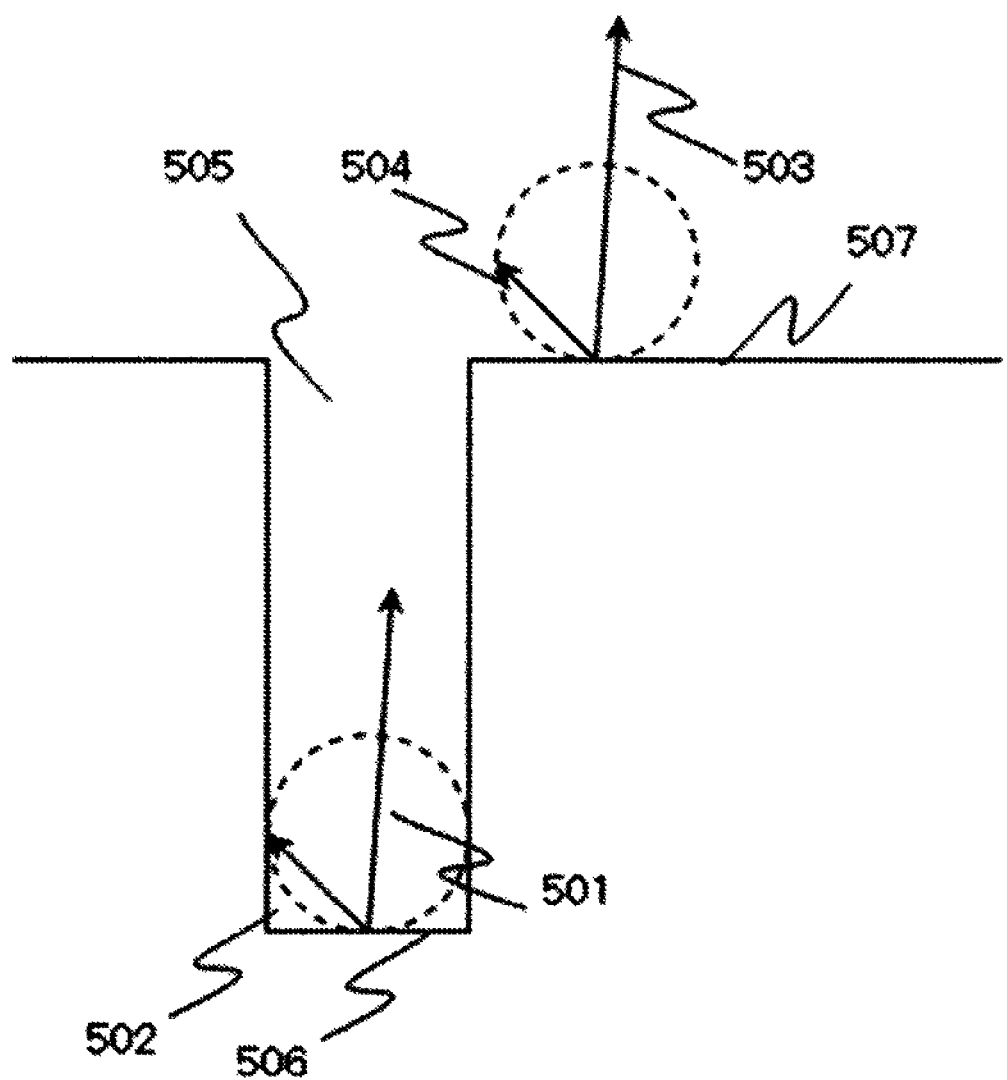
[FIG. 5]

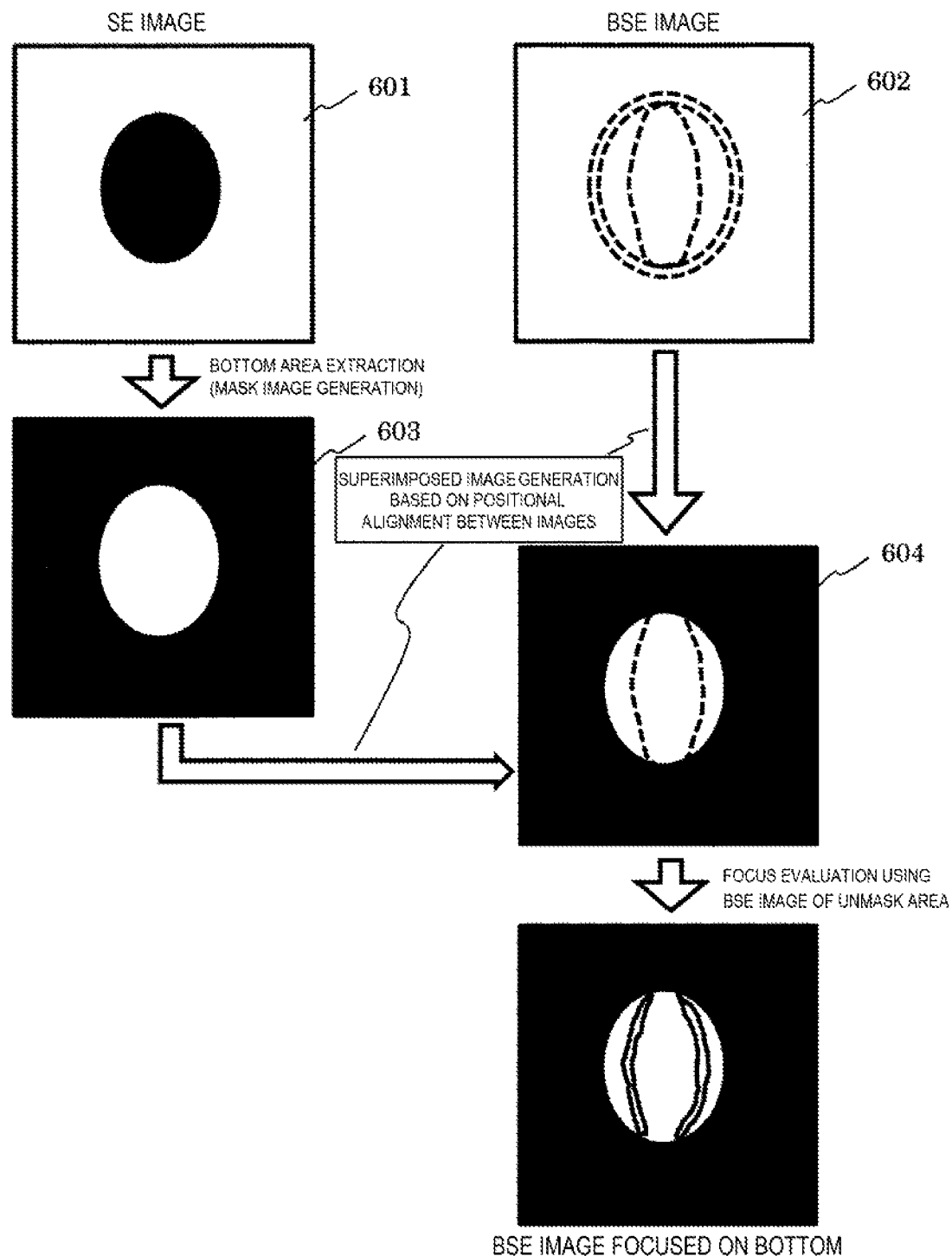

[FIG. 7]
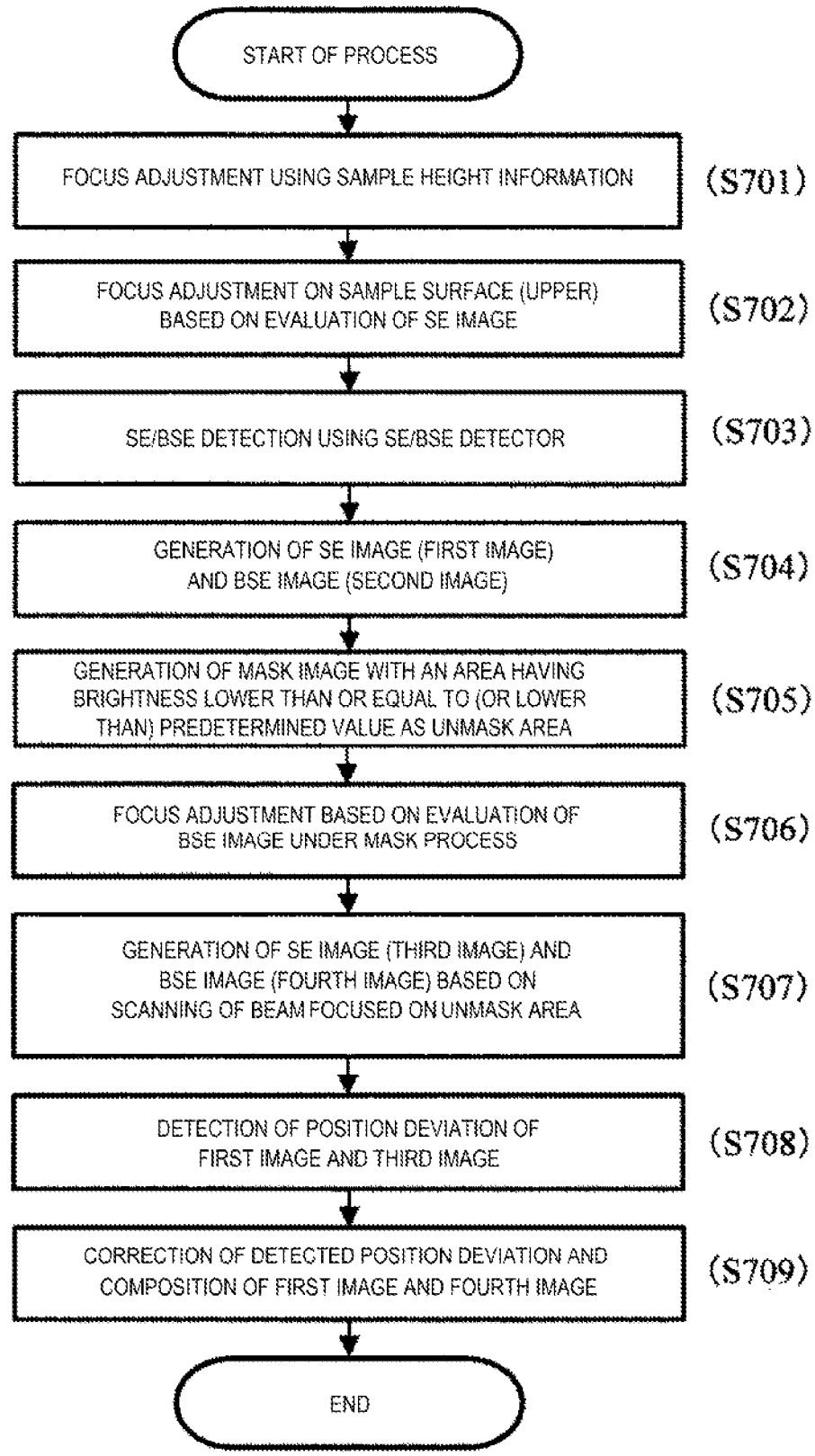

[FIG. 8]
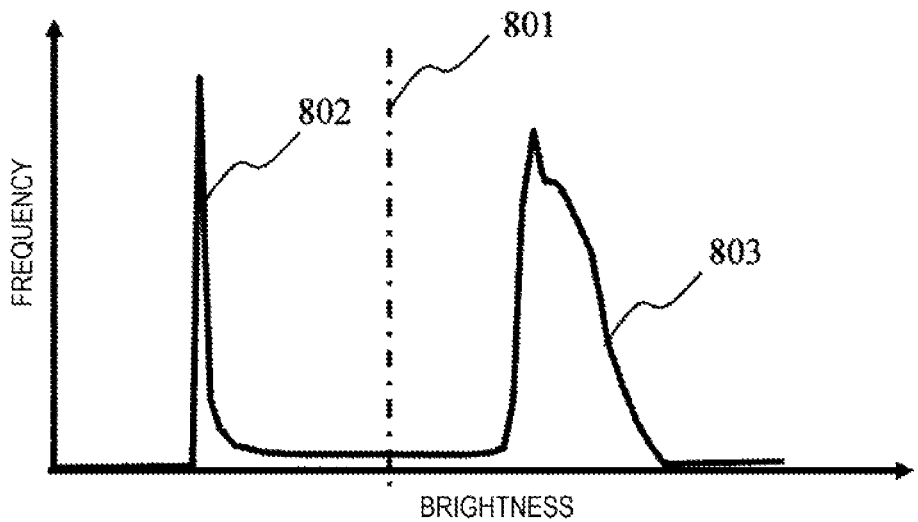
[FIG. 9]
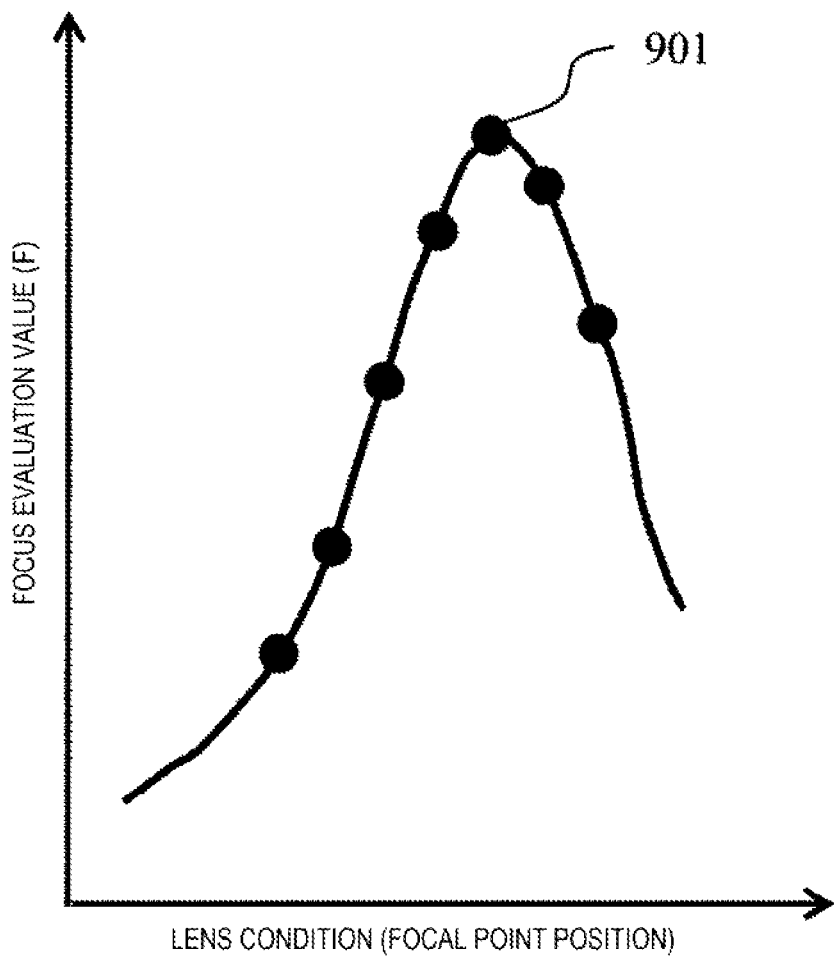

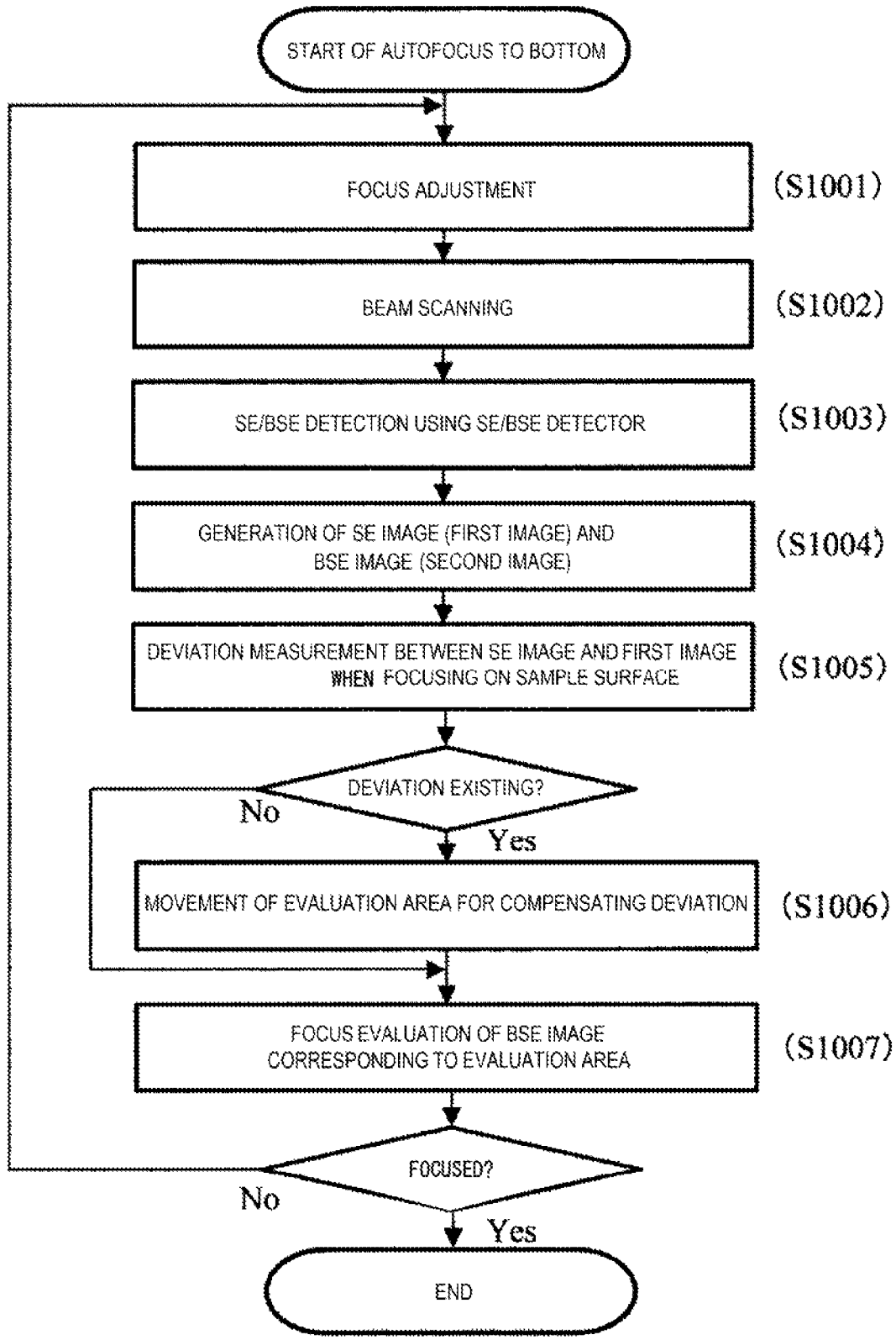

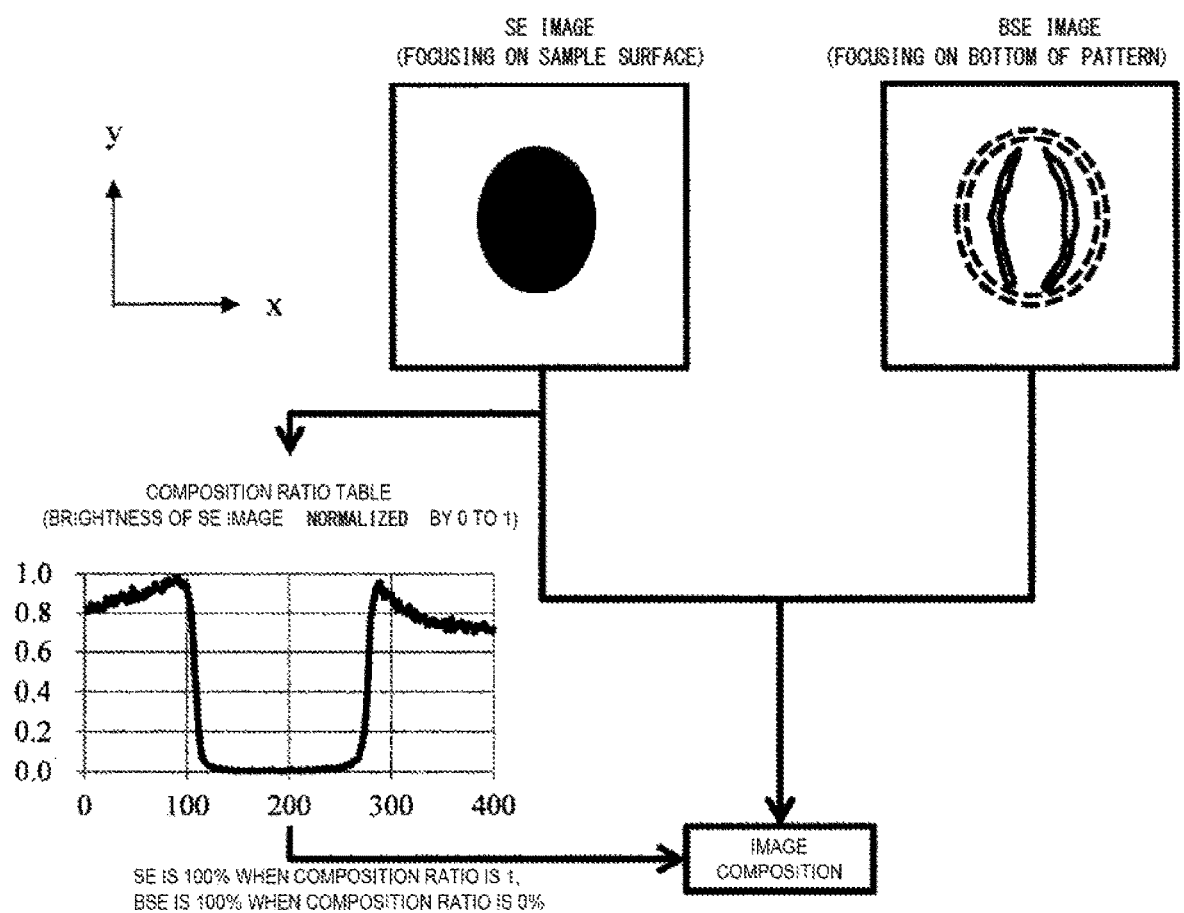
[FIG. 11]

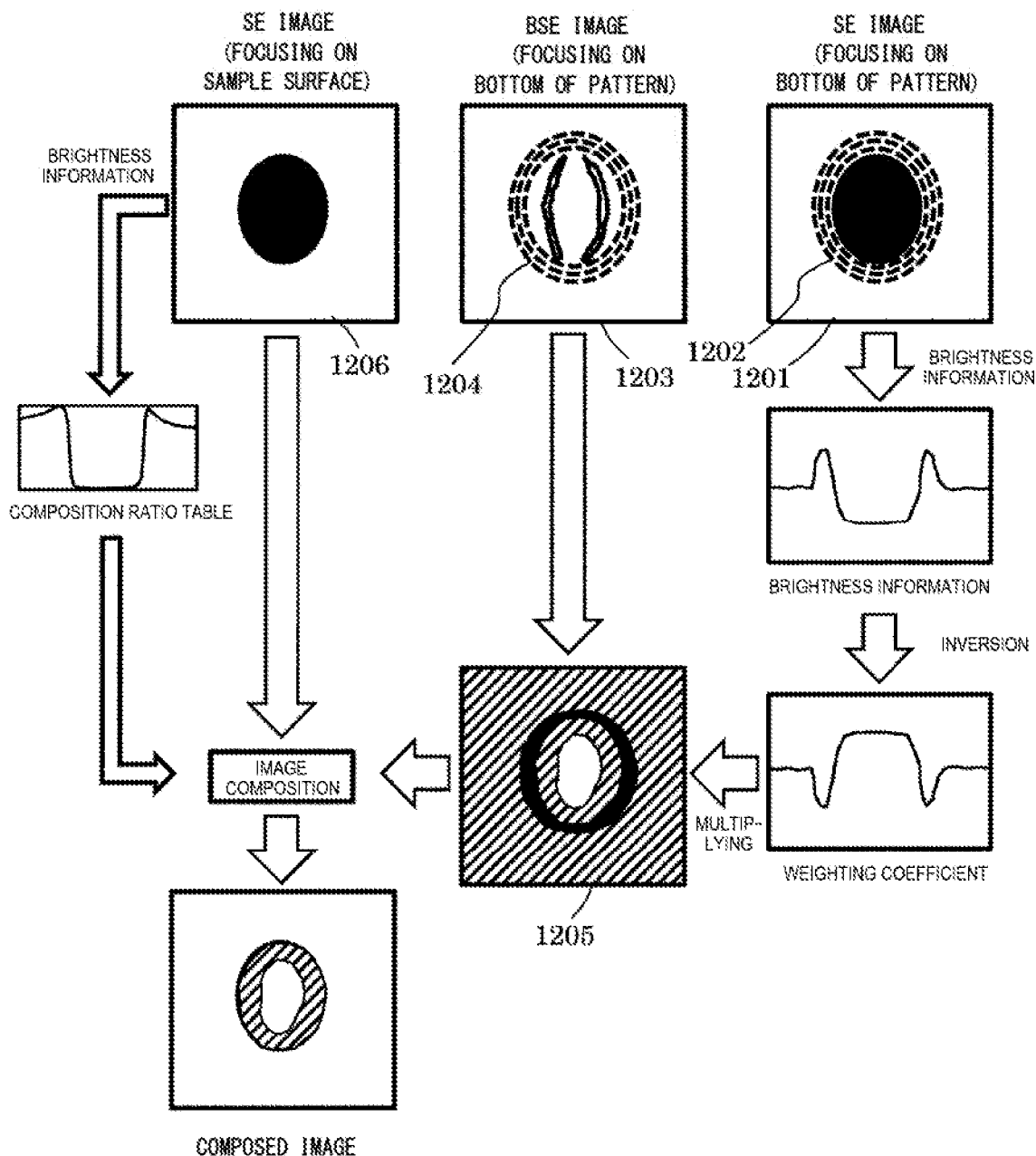
[FIG. 12]

CHARGED PARTICLE BEAM APPARATUS

TECHNICAL FIELD

The invention relates to a charged particle beam apparatus and a method of forming a sample image, and particularly to a charged particle beam apparatus used for forming the sample image of an area including a pattern shaped of a deep hole or a deep groove.

BACKGROUND ART

A deep-hole observation method using a charged particle beam apparatus such as a scanning electron microscope (SEM) is known. PTL 1 discloses an SEM having two stages of detectors by which electrons (electrons (high angle electrons) passing through a trajectory having a relatively small angle with respect to the optical axis) passing through a trajectory near the optical axis of the electron beam and electrons (electrons (low angle electrons) passing through a trajectory having a relatively large angle with respect to the optical axis relative to the high angle electrons) passing through a trajectory relatively separated from the optical axis of the electron beam are discriminated and detected in order to form a high-contrast hole bottom image based on the electrons emitted from the bottom of a deep hole such as a contact hole. PTL 2 and PTL 3 disclose the SEM in which a deflector for secondary electrons used for controlling the trajectory of secondary electrons is provided so as to make detection signals of the plurality of detectors uniform.

BACKGROUND ART LITERATURE

Patent Literature

PTL 1: Japanese Patent No. 3456999 (Corresponding U.S. Pat. No. 5,493,116)
PTL 2: Japanese Patent No. 5033310 (Corresponding U.S. Pat. No. 7,449,690)
PTL 3: Japanese Patent No. 4943733 (Corresponding U.S. Pat. No. 8,153,969).

SUMMARY OF INVENTION

Technical Problem

The scanning electron microscope with a relatively long depth of focus can obtain the image in which the sample surface and the bottom are in focus even when observing the deep hole and the like. However, recently, the depths of the hole and the groove formed on a semiconductor device are deepened, and holes or grooves deeper than the depth of focus of the scanning electron microscope have been found here and there. In order to measure and inspect such deep holes and deep grooves with high accuracy, it is necessary to obtain images and the like by focusing on the sample surface and the bottom of the hole and the groove, respectively. However, in order to focus on each of the sample surface and the bottom, if one attempts to acquire one image and then acquire the other image, a visual field deviation occurs between the images and it may be difficult to obtain images of the same visual field. In PTL 1 to PTL 3, there is no argument about the visual field deviation that occurs when focusing on the sample surface and the bottom respectively, for a pattern with a high aspect ratio.

A charged particle beam apparatus, aiming at obtaining an image and the like focused on the sample surface and the bottom while preventing the visual field deviation and the like occurred when focusing on the sample surface and the bottom respectively, is proposed hereinafter.

Solution to Problem

According to one embodiment for achieving the above object, a charged particle beam apparatus is proposed, which includes lenses which focus a charged particle beam emitted from a charged particle source; detectors which detect charged particles obtained based on irradiating of a sample with the charged particle beam; arithmetic processing units which generate an image of an irradiation area of the charged particle beam based on an output of the detectors; and a control unit which controls the lenses, in which the arithmetic processing units: form a first image, which is based on detection of first energy charged particles, based on the irradiation with a beam whose focus is adjusted on a sample surface side by the control unit; form a second image which is based on detection of second energy charged particles having a relatively higher energy than the first energy and a third image which is based on the detection of the first energy charged particles, based on the irradiation with a beam whose focus is adjusted on a bottom side of a pattern included in the sample by the control unit; acquire a deviation between the first image and the third image; and compose the first image and the second image so as to correct the deviation.

Further, according to another embodiment for achieving the above object, a charged particle beam apparatus is proposed, which includes lenses which focus a charged particle beam emitted from a charged particle source; detectors which detect charged particles obtained based on irradiating of a sample with the charged particle beam; arithmetic processing units which generate an image of an irradiation area of the charged particle beam based on an output of the detectors; and a control unit which controls the lenses, in which the arithmetic processing units: form the first image, which is based on the detection of the first energy charged particles, based on the irradiation with the beam whose focus is adjusted on the sample surface side by the control unit; form the second image which is based on the detection of the second energy charged particles having a relatively higher energy than the first energy, based on the irradiation with the beam whose focus is adjusted on the bottom side of the pattern included in the sample by the control unit; and acquire a composite ratio of the first image and the second image based on brightness distribution information of the first image.

According to the above configuration, an image and the like focused on the sample surface and the bottom can be obtained while preventing the visual field deviation and the like occurred when focusing on the sample surface and the bottom respectively.

BRIEF DESCRIPTION OF DRAWINGS

FIG. 1 is a schematic diagram of a scanning electron microscope.

FIG. 2 is a flowchart showing a process of forming a composite image.

FIG. 3 is a diagram illustrating a process of composing a secondary electron image and a reflected electron image based on a deviation evaluation between secondary electron images.

FIG. 4 is a diagram illustrating an example of a GUI screen displayed on an image display unit.

FIG. 5 is a diagram illustrating trajectories of electrons emitted from the sample surface and electrons emitted from a hole bottom.

FIG. 6 is a diagram illustrating a process of generating a mask image based on the secondary electron image and performing a focus adjustment of the reflected electron image based on the focus evaluation of an area selected according to the mask image.

FIG. 7 is a flowchart illustrating a process of forming a composite image.

FIG. 8 is a diagram illustrating a brightness histogram of the secondary electron image.

FIG. 9 is a diagram illustrating a relationship between a lens condition and a focus evaluation value.

FIG. 10 is a flowchart illustrating a process of performing the focus adjustment while adjusting a position of a focus evaluation area.

FIG. 11 is a diagram illustrating a process of acquiring a composite ratio of the secondary electron image and the reflected electron image based on a brightness distribution of the secondary electron image to compose the images.

FIG. 12 is a diagram illustrating a process of acquiring a weighting coefficient of the reflected electron image using an inverted waveform of a brightness distribution of the secondary electron image.

DESCRIPTION OF EMBODIMENTS

In embodiments to be described below, a charged particle beam apparatus which includes arithmetic processing units that perform pattern measurement with high accuracy will be described. Also, the charged particle beam apparatus described below is controlled by a control unit which includes a computer processor and a non-transitory computer readable medium. When executed by the computer processor, the non-transitory computer readable medium is encoded by computer instructions that cause the system controller to execute a predetermined processing, and controls the charged particle beam apparatus according to a processing step to be described later.

As a miniaturization of a semiconductor manufacturing process progresses, not only for the miniaturization on a two-dimensional plane, techniques for developing devices for increasing the degree of accumulation by three-dimensional stacking are spreading. As the structure becomes complicated year by year, it is expected that etching and filling-up CVD become difficult to form samples with high aspect ratio such as deep holes and grooves. Also, in etching of deep holes and deep grooves having a large aspect ratio, it is necessary to vertically control the etching gas over the entire surface of a wafer. If the control is erroneous, event problems such as oblique etching occur. For the purpose of confirming the yield in the semiconductor measurement and inspection apparatus, the need for measuring and managing not only the diameter of a Top (a sample surface) and a Bottom (a hole bottom or a groove bottom) but also the positional deviation between the Top and the Bottom with the above-mentioned pattern having a large aspect ratio and the like is increasing.

In addition, it is expected that the necessity for measuring and inspecting each of the Top and the Bottom of the hole or the groove deeper than the focal depth of the charged particle beam apparatus with high accuracy increases. In particular, it is expected that the necessity for performing measurements of a dimension of each of the Top and the Bottom and the deviation between the Top and the Bottom and the like using the signals obtained in a state of correctly focusing on the Top and the Bottom respectively increases. On the other hand, when an optimum focus value is set for each of the Top and the Bottom, and each signal can be detected, it is possible to measure with high accuracy at the Top and the Bottom. However, the focus value is changed so that the imaging visual field position between the Top and the Bottom deviates. For example, if there is a deviation between the Top and the Bottom when measuring the deviation or generating the composite image, measurement with high accuracy and proper image generation cannot be expected. Also, the dimensions of the Top and the Bottom cannot be acquired by one measurement.

Hereinafter, the charged particle beam apparatus capable of measurement and image generation with high accuracy while preventing a visual field deviation even in the case of measuring or generating an image of a pattern with a high aspect ratio such as a deep hole and a deep groove and a method of forming a sample image will be described.

The embodiments described below mainly describes the charged particle beam apparatus which includes a detector for separating and detecting charged particles emitted from a sample into secondary electrons and reflected electrons. The charged particle beam apparatus includes a discriminator used for selectively acquiring reflected electrons emitted from the sample only by a necessary signal. By detecting the positional deviation of the images of the Top and the Bottom by image processing when imaging is performed in two stages by changing the focus value, it is possible to measure the deviation amount of the Top and the Bottom. By composing images imaged in two stages by using the positional deviation amount, an image with an improved visibility of the Top and the Bottom dimensions and the deviation is generated.

According to the above configuration, it is possible to generate an image that can measure the deviation of the Top and the Bottom at the time of pattern formation by etching and the like which is difficult to judge or measure with a high aspect sample such as the deep hole or the deep groove.

FIG. 1 is a diagram illustrating an outline of the scanning electron microscope. An extraction voltage is applied between an electric field emitting cathode 1 and an extraction electrode 2 to draw out a primary electron beam 3. The primary electron beam 3 (electron beam) is adjusted to be converged by the condenser lens 4 and scan the sample 6 two-dimensionally around a lens center of the objective lens 5 as a fulcrum. The accelerated primary electron beam 3 is confined by a lens action of the objective lens 5 and reaches the sample 6 held on a stage 7.

Signal electrons generated in the sample 6 by irradiation of the primary electron beam 3 are classified into secondary electrons 8 and reflected electrons 9 according to a kinetic energy. Since the energy of the secondary electrons 8 is low and spread of the secondary electrons 8 is large, the secondary electrons 8 travel on an optical axis in the direction opposite to the primary electron beam 3, then collide with a secondary electron control board 10, and is detected by a secondary electron detector 14. Since the reflected electrons 9 (Backscattered Electron (BSE)) has high energy, the reflected electrons 9 travel on the optical axis in the direction opposite to the primary electron beam 3 and passes through a hole of the secondary electron control board 10. The signal electron deflector 11 deflects the electrons emitted from the sample toward the reflecting board 13 so that the electrons emitted from the sample do not travel toward the electric field emitting cathode 1. The signal electron deflector 11 employs a Wien filter deflector to prevent deflection of the electron beam out of the axis while deflecting the electrons emitted from the sample out of the optical axis of the electron beam. Regarding the deflected reflected electrons 9, only necessary signals are detected selectively by an energy discriminator 12 and unnecessary signals are discarded as noise, then the deflected reflected electrons 9 collide with the reflecting board 13. The secondary electrons are emitted from the reflecting board 13 by collision of the reflected electrons 9 with the reflecting board 13, and the secondary electrons are detected by a reflected electron detector 15.

The signals detected by the secondary electron detector 14 and the reflected electron detector 15 are digital imaged by arithmetic units 16 and stored in an image memory 18. Further, in this embodiment, a detection method is described as an example that electrons emitted from the sample collide with a secondary electron conversion electrode such as a reflection board, and the electrons emitted from the reflecting board are detected by the collision. However, it is not limited to the detection method, and, for example, a detection method of directly detecting electrons emitted from the sample by disposing the detection surface of the detector on the trajectory of electrons emitted from the sample may also be adopted. Also, the electrons detected by the reflected electron detector 15 are actually secondary electrons generated in the reflecting board. However, secondary electrons are generated from the reflecting board according to the incident amount of the reflected electrons. Since the detected secondary electrons reflect the amount of the reflected electrons, it is referred to as the reflected electron detector, and defined as detecting the reflected electrons substantially in the embodiment. According to the device exemplified in FIG. 1, for example, the secondary electrons having energy (first energy) of 0 to 50 eV and the reflected electrons having energy (second energy) of 50 eV or more can be detected separately.

The image memory 18 has a function of storing superimposing (composing) images (image data) for improving an S/N ratio. For example, in the first time, eight images in which the secondary electrons are detected are superimposed and stored to form one finished image. In the second time, 128 images in which the reflected electrons are detected are superimposed and stored to form one accumulated image. The composition ratio of the images acquired in the first time and second time is changed to form one accumulated image. That is, images formed in one or more X-Y scan units are composed to form a final image.

The number of images (the number of accumulated frames) for forming one finished image can be arbitrarily set from the input device 25, and appropriate values is set in view of conditions such as generation efficiency of the secondary electrons and the reflected electrons. Also, images formed by accumulating a plurality of images can be imaged separately in two or more different conditions, and an image desired to be finally obtained can be formed by setting a composition method or a composition ratio to an appropriate value. Also, a request for image composition may be issued at the time when the desired number of images are stored in the image memory. The arithmetic unit 16 can also detect the positional deviation between the images obtained by the brightness adjustment or the plurality of scans by using the signal detected by the setting from the input device 25.

The primary electron beam 3 is converged as a minute spot on the sample 6 by the objective lens 5 controlled by an objective lens control power supply 17. In addition, by applying a negative voltage to the stage 7 from a retarding voltage power supply 20, it is possible to form a decelerating electric field against the electron beam and to adjust a focus condition of the beam by adjusting the applied voltage.

Since the electric field formed by the negative voltage applied to the sample or the stage is an electrostatic lens used for focusing the beam, it is possible to adjust the focus of the beam in place of the objective lens 5 or together with the objective lens 5.

In the image display unit 19, the image data set in the image memory 18 can be displayed. It is also possible to provide a storage unit 21 to store the image data set in the image memory 18 in a storage medium.

From the input device 25, it is possible to designate an execution of capturing of an image, capturing conditions of an image (scanning speed, scanning direction, number of images accumulated, focus position, and visual field deviation correction method), a method of composing an image, outputting and storing of an image, and the like.

The control unit 24 connects and controls the arithmetic units 16 (arithmetic processing units), the objective lens control power supply 17, the retarding voltage power supply 20, an accelerating voltage power supply 22, the lens control power supply 23, the image memory 18, the storage unit 21, the image display unit 19, and the input device 25.

Further, the scanning electron microscope illustrated in FIG. 1 has a function of forming a line profile based on the detected secondary electrons 8 or reflected electrons 9 and the like. The line profile is formed on the basis of the amount of electrons detected when the primary electron beam is one-dimensionally or two-dimensionally scanned, or brightness information of the sample image, and the like. The obtained line profile is, for example, used for measuring the dimension of the pattern formed on a semiconductor wafer.

Although the explanation of FIG. 1 has been made that the control unit is integrated with the scanning electron microscope or corresponds to the scanning electron microscope, the invention is not limited thereto. Processing described below may be performed by a control processor provided separately from a scanning electron microscope mirror body. At that time, a transmission medium used for transmitting a detection signal detected by the secondary electron detector 14 or the reflected electron detector 15 to the control processor and transmitting a signal from the control processor to the lenses, the deflectors and the like of the scanning electron microscope, and an input and output terminal for inputting and outputting a signal transmitted via the transmission medium are required.

It is also possible to register a program which carries out the processing described below in the storage medium in advance and to execute the program with a control processor which has an image memory and supplies necessary signals to the scanning electron microscope. That is, the embodiments of the invention described below can also be established as an invention of a program that can be employed in a charged particle beam apparatus such as a scanning electron microscope equipped with an image processor.

Embodiment 1

In a following embodiment, an image generation method capable of realizing a measurement with high accuracy of the dimensions and the deviations of the Top (for example, the sample surface) and the Bottom (for example, the hole bottom and the groove bottom) of a sample formed with the high aspect ratio such as the deep hole or the groove and a measurement method using signal electrons will be described. In order to manifest information based on the electrons emitted from the bottom of the pattern having a high aspect ratio (in the case of the deep hole or the deep groove, it is defined as "a depth of the hole or the groove divided by a width of the hole bottom or the groove bottom") such as the deep hole and the deep groove, it is necessary to selectively detect electrons with relatively high energy, for example, the reflected electrons.

As illustrated in FIG. 5, among the electrons emitted from the bottom 506 of the high aspect structure (hole 505), the reflected electrons 501 can escape from the sample surface. There is a high possibility that the secondary electrons 502 collide with the side wall of the structure before escaping from the sample surface. In this way, the reflected electrons 501 can be detected with a relatively high efficiency, while the detection efficiency of the secondary electrons 502 is low. On the other hand, both the reflected electrons 503 and the secondary electrons 504 emitted from the structure surface 507 can be detected with high efficiency. That is, since the detection efficiency of the secondary electrons 502 is low at the bottom of the pattern having the high aspect ratio, an image having a dark bottom as compared with the sample surface is formed as a result.

On the other hand, if the reflected electrons can be selectively detected, the difference between the detection efficiency of the bottom and the detection efficiency of the sample surface is suppressed, so the information on the bottom of the sample can be manifested.

Therefore, in the embodiment, the image of the bottom of the sample is formed based on the selective detection of high-energy electrons such as the reflected electrons. The selective detection of the high-energy electrons is performed by using an element which blocks a passage of, for example, low-energy electrons called an energy filter. Also, the image of the sample surface is formed based on the detection of the low-energy electrons having a relatively large signal amount such as the secondary electrons. In the embodiment, in order to generate an image using both an image obtained from the sample surface and an image obtained from the bottom of the sample as described above, the following scanning electron microscope which includes the control unit that automatically performs the image processing and a device control will be described. Specifically, a secondary electron image (first image) is obtained by focusing on the sample surface, and a secondary electron image (third image) and a reflected electron image (second image) are obtained by focusing on the bottom of the pattern. Further, centers of gravity of the patterns (e.g. a hole pattern) included in the first image and the third image are acquired, and the positional deviation between the centers of gravity of the patterns is acquired.

In the embodiment, a focus adjustment is performed so that the focus is on the sample surface and the bottom of the pattern in a state where the visual field position is fixed. However, there is a possibility that the visual field may deviate due to an influence of electrification and the like before and after the focus adjustment. By comparing the images before and after the focus adjustment, it is possible to handle the deviation amount correctly. Further, the first image is the secondary electron image having the high S/N ratio in which the center of gravity of the pattern is easy to acquire. The third image is, although a contour of the pattern is unclear, a secondary electron image having the high S/N ratio in which the center of gravity of the pattern is easy to acquire. Therefore, the deviation amount between the positions of centers of gravity can be acquired correctly.

A positional alignment is performed so as to correct the deviation between the first image and the second image by using a further acquired deviation amount and information of a deviation direction (vector information). The two images after the positional alignment are composed to generate the composite image. The composite image formed through the above-described process is an image in which information on both the sample surface and the sample bottom was manifested. Further, a reflected electron image (fourth image) obtained in a state of focusing on the sample surface may be acquired when there is necessity in other cases.

FIG. 2 is a flowchart illustrating a composite image generating process. Further, in the scanning electron microscope exemplified in FIG. 1, a detector which detects high-energy electrons such as the reflected electrons and a detector which detects low-energy electrons such as the secondary electrons are provided so that both of the high-energy electrons and the low-energy electrons can be detected at the same time. However, it is not limited to this, and it is also possible to generate the composite image as described above by an apparatus having one detector. In that case, since it is impossible to acquire both images of secondary electrons and reflected electrons by one imaging, imaging is performed respectively and the images are set in the image memory 18.

However, for the apparatus having one detector, even when the reflected electron image and the secondary electron image are obtained under the same focus condition, since a time difference occurs in acquisition timing, it is desirable to adopt the scanning electron microscope equipped with a plurality of detectors capable of simultaneously obtaining the high energy electrons and the low energy electrons at the same visual field position under the same focus condition.

Before the start of the processing process exemplified in FIG. 2, the focus of the beam is adjusted to the Top side in advance. The operator may adjust the focus manually, or the focus may be automatically adjusted by autofocus and the like. Further, when adjusting by autofocusing, if a proportion of the area of the sample surface in the visual field is large, the focus is approximately on the sample surface, so it is preferable to perform a normal autofocusing. On the other hand, when the proportion of the area of the sample surface in the visual field is small, since the focus is in an area on the sample height where the area proportion is relatively large rather than the sample surface, in such case, it is preferable to set in advance the focus evaluation area that selectively includes the sample surface, and perform autofocus by performing focus evaluation selectively in the area.

First, the input device 25 instructs the execution of a sequence of the composite image generation. The control unit 24 controls at least one of the objective lens control power supply 17 and the retarding voltage power supply 20 and performs the focus adjustment to focus on the TOP. The secondary electron image (Secondary Electron Image: SE image) 301 and the reflected electron image (BSE image) 302 are imaged (step 201) and registered in the image memory 18 in the focus adjustment state. Since there is a possibility of occurrence of image drift during the frame accumulation due to electrification, the drift amount between frames may be detected and corrected at the time of imaging SE image 301.

Next, at least one of the objective lens control power supply 17 and the retarding voltage power supply 20 is controlled (step 202) so that the focus is on the bottom. In this case, for example, the relationship between an elevation difference (depth) between the sample surface and the pattern bottom and the focus condition (excitation current of the objective lens, voltage applied to the stage) is tabled in advance, and the focus condition is adjusted based on the input of depth information. The focus condition may be manually adjusted while monitoring the display screen so that the image of the hole bottom of the reflected electron image becomes clearer. At this time, the focus value on the Top side before change is stored.

The control unit 24 scans the electron beam to form the secondary electron image 303 and the reflected electron image 304 in a state where the bottom is focused, detects the secondary electrons and the reflected electrons obtained by the scanning, and registers the image data in the image memory 18 (step 203). Since there is a possibility of occurrence of image drift during the frame accumulation due to electrification, the drift amount between frames may be detected and corrected at the time of imaging SE image 303.

The control unit 24 sets the focus condition stored in advance in step 202 and adjusts the focus position of the electron beam to TOP (step 204). The process as exemplified in FIG. 2 can start smoothly at another measurement point in the same focus adjustment condition by performing processing such as adjusting (returning to original) the focus position to TOP in step 204.

Next, in order to correct the visual field deviation before and after the focus adjustment, the SE image 301 and the SE image 303 obtained in steps 201 and 203 are readout from the image memory 18, and the deviation between the SE image 301 and the SE image 303 is detected (step 205). At this time, the deviation amount and the deviation direction are acquired by using a pattern matching algorithm according to a normalized cross-correlation method. Further, a pattern detection algorithm is not limited to the normalized correlation algorithm and an algorithm such as phase-only correlation and the like may be used. In this case, when matching is made at the position deviated by $(\Delta x, \Delta y)$, $(-\Delta x, -\Delta y)$, for example, is registered as a correction data in a predetermined storage medium.

In step 206, the position of the BSE image is corrected by using the correction data acquired in step 205, and the position-corrected BSE image 305 subjected to a position correction processing is registered in the image memory 18. Further, in step 207, the position of the center of gravity of the hole pattern included in the SE image 301 and the position of the center of gravity of the hole pattern included in the position-corrected BSE image 305 are calculated so that the deviation between the calculated positions of the centers of gravity is acquired.

The deviation between the positions of the centers of gravity thus calculated is displayed on the display device or stored in a predetermined storage medium as an overlay error between the layers of the semiconductor device. The overlay error between layers can be known by such processing. Further, the deviation may be measured from the distance from the position of the center of gravity acquired from a contour line (a line segment extracted by the thin lining process for the edge portion) of the pattern edge from the SE image of the top to the position of the center of gravity of the brightness distribution of the bottom BSE image. In this way, it is possible to identify appropriate centers of gravity positions suitable for both image states by changing processing methods of extracting the position of the center of gravity on the top side and the bottom side, and as a result, a highly accurate overlay error measurement becomes possible.

Next, the SE image 301 and the position-corrected BSE image 305 are composed to generate a composite image 306 (step 208). When composing images, for example, since it is sufficient to emphasize the information of the SE image 301 on the TOP side and the information of the position-corrected BSE image 305 on the bottom side, it is preferable to generate a composite image by, for example, extracting the pattern contour line from the SE image 301, applying an information on the SE image 301 to the outside of the contour line, and applying the information of the position-corrected BSE image 305 inside the contour line. Another composition method will be described later.

The composite image is displayed as a sample image on the image display unit 19. The composite image can also be stored in a recording device 30.

Further, the graphical user interface screen exemplified in FIG. 4 is displayed on the image display unit 19. The control unit 24 controls the scanning electron microscope according to device conditions set on the GUI screen. On the GUI screen, a magnification (401) and a scan size (402) can be set in a common parameter setting window when the Top and the Bottom image are imaged. In the setting window of an imaging condition of the Top image of the sample, it is possible to designate the number of accumulated frames (403) and the like for obtaining an image with improved S/N. Further, the device conditions set in the Top image condition setting window are set as the device conditions when the Top is in focus, and the device conditions set in the Bottom image condition setting window are set as the device conditions when the Bottom is in focus. Further, a setting window used for setting an electron beam scanning method for preventing sample electrification may be provided. It is possible to specify the number of accumulated frames (403) for obtaining the image with improved S/N ratio in the setting window of the imaging condition of the bottom image of the sample, correction (0404) of the image drift during the frame accumulation due to electrification and a focus position (405) for obtaining an image focused on the Bottom. Further, the setting window used for setting the electron beam scanning method for preventing the sample electrification may be provided.

In the setting window (406) of the detection method of the positional deviation between the Top and the Bottom, the detection method can be designated according to the shape of a target pattern. In "X, Y DIRECTION", the positional deviations in both X and Y directions are detected. In "X DIRECTION" and "Y DIRECTION", the positional deviation is detected in only one direction. Further, the detection algorithm and the like may also be set. In the patterns of the deep hole and the deep groove as in the first embodiment, "X, Y DIRECTION" is set so that detections in both directions are performed.

In the composition ratio setting window (407), it is possible to set a method of composing the SE image and the BSE image at the time of image composition. "Input value", "Weighting 1" and "Weighting 2" are displayed as pull-down menus of the setting window 407, and an arbitrary composition method can be selected. When "Input value" in this window is set, the composition ratio of the Top image and the Bottom image can be set in a numeric input window. When an execution button (408) is pressed, a processing flow illustrated in FIG. 2 is started.

Embodiment 2

In the embodiment, a composite image generation method and a scanning electron microscope will be described with reference to FIGS. 6 and 7. The composite image generation method includes a process of appropriately evaluating the focus evaluation value of the bottom and focusing the beam on the bottom based on the evaluation when focusing on the bottom of the hole pattern and the like. FIG. 6 illustrates a flow of processing in which, an evaluation area for performing the focus evaluation of the bottom is set based on an analysis of an image focused on the sample surface side, and the focus to the bottom is adjusted based on the focus evaluation within the evaluation area. FIG. 7 is a flowchart showing the processing process. Further, the processing in the embodiment is performed by setting the bottom setting in a focus adjustment setting window 410 included in the GUI screen exemplified in FIG. 4 to "Auto". Further, in FIG. 4, "Fixed Value" is selected, and in this setting state, the focus adjustment to the bottom is performed based on the input of the depth of the deep hole or the deep groove to a focus position setting window 405. A relationship between the depth and the negative voltage applied to the objective lens or the sample is preliminarily tabled and stored in a predetermined storage medium so that the control unit 24 performs the focus adjustment by referring to the information stored in the storage medium.

The control unit 24 performs the focus adjustment by using a sample height information first (step 701). Measurement of the sample height is performed by using, for example, a sample height measuring device called a Z sensor, and focus adjustment is performed so that the focus is roughly on the measured height. Next, while evaluating the focus evaluation value of the sample surface, the focus is changed, and the lens condition (at least one of an excitation condition of the objective lens and a negative voltage application condition to the sample stage) is set so as to focus on the sample surface (step 702). After the focus adjustment, the secondary electrons and the reflected electrons are detected by the secondary electron detector 14 and the reflected electron detector 15 incorporated in the scanning electron microscope exemplified in FIG. 1 (step 703), and the SE image 601 (first image) and the BSE image 602 (fourth image) are formed (step 704).

As described above, while the secondary electrons emitted from the sample surface can be detected with high efficiency, the secondary electrons emitted from the bottom of the pattern cannot escape from the sample surface, and the amount of detection is limited. Therefore, the sample surface and the pattern bottom have a great difference in luminance. FIG. 8 is a graph illustrating the brightness distribution of pixels included in the SE image. As exemplified in FIG. 8, a low brightness distribution 802 which is a set of pixel values of a pattern bottom area, and a high brightness distribution 803 which is a set of pixel values of the sample surface area, are clearly divided.

In the embodiment, a threshold value 801 is set to a predetermined brightness by using the phenomenon as described above, and a mask image 603 is generated, in which a pixel area exceeding the threshold value 801 is masked (step 705). Regarding the mask image 603, a low brightness pixel area is not masked. If an electron microscope image and the mask image are superimposed, an image is resulted in which a low brightness area such as the bottom of the pattern is selectively displayed.

The focus adjustment is performed using the image 604 in which the mask image formed in the above way is superimposed on the BSE image by using the pattern matching algorithm and the like and the unmasked area (unmask area) is set as the focus evaluation area (step 706). The SE image (third image) and the BSE image (second image) are generated by a beam scanning while maintaining the focus adjustment state after the focus adjustment (step 707). Next, the positional deviation between the first image and the third image is acquired (step 708). The first image and the second image are superimposed so as to compensate for the positional deviation and generate a composite image (step 709).

The focus adjustment on the bottom of the pattern can be performed with high accuracy by the selective focus evaluation of the unmask area and it is possible to generate a composite image with the focus with high accurately over the entire image. Further, in this embodiment, in order to enable the selective focus evaluation of the area corresponding to the bottom of the pattern included in the image, a processing is performed to mask the other areas. However, it is possible to achieve the same effect by another image processing method selectively performing focus evaluation in a specific area (focus evaluation area) without providing the mask area. For example, a same effect as in the case where the mask area is provided can be expected by performing computations that do not perform the focus evaluation in areas other than a predetermined area.

Further, In order to perform the autofocus, it is necessary to acquire an image for each focus condition. However, it is considered that the focus changes so that the field of view is deviated even in the process of acquiring the image, and the focus evaluation in the appropriate area cannot be done. Therefore, an example for performing the appropriate focus evaluation at the time of execution of autofocus is further described in the embodiment. FIG. 10 is a flowchart illustrating the details of the focus adjustment process in step 706 of FIG. 7. The focus position is changed from the state in which the focus is focused on the sample surface (the lens condition is changed). After the change, the beam scanning is performed to detect the SE and the BSE, and generate the SE image and the BSE image (steps 1001 to 1004).

Next, the SE image obtained in step 1003 is compared with the SE image obtained in the state in which the focus is focused on the sample surface, and the deviation between the SE images is measured by using the pattern matching algorithm and the like (step 1005). When the deviation is zero or is less than the predetermined value, the focus evaluation of the area in the BSE image corresponding to the evaluation area (unmask area) is performed (step 1007). On the other hand, if there is any positional deviation between the SE image obtained in step 1003 and the SE image obtained in a state in which the focus is focused on the sample surface, it is considered that the visual field position is shifted due to the influence of electrification and the like, and the evaluation area is not appropriately positioned at the bottom of the pattern. Therefore, in order to follow the deviation of the visual field position, the evaluation area is moved so as to compensate for the deviation measured in step 1005 (step 1006). Steps 1001 to 1007 are repeatedly executed and the focus adjustment is performed on the bottom of the pattern until a focus position (901 in FIG. 9) is recognized by the focus evaluation.

In the process of focusing while selectively evaluating the focus of the bottom of the pattern by storing the adjustment program exemplified in FIG. 10 in advance in a predetermined storage medium and executing with the control unit 24, the focus can always be evaluated at a correct position, and it is possible to perform the accurate focus adjustment to the bottom of the pattern.

Embodiment 3

Next, a method for optimizing the composition ratio when composing the SE image and the BSE image is described. The control unit 24 automatically executes processing to be described later by selecting "Weighting 1" in the composition ratio setting window 407 of the GUI screen exemplified in FIG. 4.

In Embodiment 1 and Embodiment 2, for example, in the case of a hole pattern, a composed image is generated such that the hole bottom becomes the BSE image and the sample surface becomes the SE image. However, depending on the state of the detection signal, it is possible to form a high contrast image over the entire image by mixing the BSE image and the SE image at an appropriate ratio. FIG. 11 is a diagram illustrating the principle. First, the SE image on the sample surface and the BSE image at the bottom of the pattern are obtained by using the image acquisition algorithm exemplified in Embodiment 1 and Embodiment 2. Then, when composing the SE image and the BSE image, the brightness distribution information of the SE image is obtained. Further as exemplified in FIG. 11, the brightness distribution is normalized such that the maximum brightness is 1.0, thereby a composition ratio table is generated. The brightness distribution information, which is, for example, information indicating a change of brightness in the x direction, is generated for each pixel in the y direction so that the composition ratio table is generated respectively.

The arithmetic unit 16 performs the image composition such that the SE signal is 100% and the BSE signal is 0% in the pixel having the composition ratio of 1.0. The arithmetic unit 16 performs the image composition such that the SE signal is 0% and the BSE signal is 100% in the pixel having the composition ratio of 0. By the process of adjusting the composition ratio of the BSE signal according to a strength of the SE signal, the proportion of the BSE signal can be relatively increased in the hole bottom and the like with less SE signal with respect to other parts. As a result, it is possible to form a high contrast image over the entire image.

Embodiment 4

The BSE image obtained in a state that the focus is on the hole bottom is the image, in which the hole bottom structure is clearly visible while the edge portion has a gentle change in brightness. Therefore, in the embodiment, a method of reducing the influence of the portion which has the gentle change in the brightness of the BSE image on the composed image and generating a composed image with high visibility is described. The control unit 24 automatically executes processing to be described later by selecting "Weighting 2" in the composition ratio setting window 407 of the GUI screen exemplified in FIG. 4.

In the embodiment, an example of using the secondary electron image 303 used in Embodiment 1 to lower the influence of the ambiguous part of the BSE image will be described. FIG. 12 is a diagram illustrating the image processing process. The SE image 1201 (secondary electron image 303) becomes an image in which, since the edge portion of the pattern becomes high brightness due to an edge effect and the sample surface is not in focus, the high brightness portion 1202 of the SE image 1201 is blurred and spreaded. Since the position of this high brightness portion roughly coincides with the position of the ambiguous portion 1204 of the BSE image 1203, when the intensity of the BSE image is adjusted so as to be opposite to the intensity of the high brightness portion 1204, it is possible to prevent the influence on the composed image of the portion in which the change in the brightness of the BSE image is gentle.

Therefore, the calculator 16 obtains the brightness distribution information of the SE image 1201, and inverts the brightness information to calculate the weighting coefficient. Since the influence of the edge portion can be reduced by multiplying the BSE image 1203 by a weighting factor generated by inverting the brightness information, it is possible to generate a BSE image without the portion in which the change in the brightness is gentle. It is possible to generate a clear image over the entire image without the portion in which the change in the brightness is gentle by composing the processed BSE image 1205 after multiplication and the SE image 1206 by the composition method exemplified in Embodiment 3.

REFERENCE SIGN LIST

1: electric field emitting cathode
2: extraction electrode
3: primary electron beam
4: condenser lens
5: objective lens
6: sample
7: stage
8: secondary electron
9: reflected electron
10: secondary electron control board
11: signal deflector
12: energy discriminator
13: reflecting board
14: secondary electron detector
15: reflected electron detector
16: arithmetic unit
17: objective lens control power supply
18: image memory
19: image display unit
20: retarding voltage power supply
21: storage unit
22: accelerating voltage power supply
23: lens control power supply
24: control unit
25: input device

The invention claimed is:
1. A charged particle beam apparatus including: lenses which focus a charged particle beam emitted from a charged particle source; detectors which detect charged particles obtained based on irradiating of a sample with the charged particle beam; arithmetic processing units which generate an image of an irradiation area of the charged particle beam based on an output of the detectors; and a control unit which controls the lenses,
wherein the arithmetic processing units: form a first image, which is based on detection of first energy charged particles, based on the irradiation with a beam whose focus is adjusted on a sample surface side by the control unit; form a second image which is based on detection of second energy charged particles having a relatively higher energy than the first energy and a third image which is based on the detection of the first energy charged particles, based on the irradiation with a beam whose focus is adjusted on a bottom side of a pattern included in the sample by the control unit; acquire a deviation between the first image and the third image; and compose the first image and the second image so as to correct the deviation.

2. The charged particle beam apparatus according to claim 1, comprising:
a first detector which detects the charged particles having the first energy in the charged particles emitted from the sample, and a second detector which detects the charged particles having the second energy which is relatively higher than the first energy.

3. The charged particle beam apparatus according to claim 1, wherein the arithmetic processing units selectively take a bottom of the pattern as a focus evaluation area to perform a focus evaluation.

4. The charged particle beam apparatus according to claim 3, wherein the arithmetic processing units set a pattern bottom area included in the first image as the focus evaluation area.

5. The charged particle beam apparatus according to claim 3, wherein the arithmetic processing units set an area having a brightness value less than or equal to a predetermined value in the first image as the focus evaluation area.

6. The charged particle beam apparatus according to claim 3, wherein the arithmetic processing units set an area having a brightness value more than or equal to a predetermined value in the first image as a mask area which is not an object of the focus evaluation.

7. A charged particle beam apparatus including: lenses which focus a charged particle beam emitted from a charged particle source; detectors which detect charged particles obtained based on irradiating of a sample with the charged particle beam; arithmetic processing units which generate an image of an irradiation area of the charged particle beam based on an output of the detectors; and a control unit which controls the lenses,
wherein the arithmetic processing units: form a first image, which is based on detection of first energy charged particles, based on the irradiation with a beam whose focus is adjusted on a sample surface side by the control unit; form a second image which is based on detection of second energy charged particles having a relatively higher energy than the first energy, based on the irradiation with the beam whose focus is adjusted on a bottom side of a pattern included in the sample by the control unit; and acquire a composite ratio of the first image and the second image based on brightness distribution information of the first image.

8. The charged particle beam apparatus according to claim 7, wherein the arithmetic processing units increase a ratio of the first image and compose with the second image as the brightness of the first image increases depending on the brightness distribution information of the first image.

9. The charged particle beam apparatus according to claim 7, wherein the arithmetic processing units: normalize the brightness distribution information of the first image; and increase the ratio of the first image while decreasing a ratio of the second image, as a normalized value increases, and compose the first image with the second image.

10. The charged particle beam apparatus according to claim 7, wherein the arithmetic processing units: form a third image, which is based on the detection of the first energy charged particles, based on the irradiation with the beam whose focus is adjusted on the bottom side of the pattern included in the sample by the control unit; weighted multiply inversion information obtained by inverting a brightness distribution of the third image to the second image; and compose the weighted multiplied second image with the first image.

11. A charged particle beam apparatus including: lenses which focus a charged particle beam emitted from a charged particle source; detectors which detect charged particles obtained based on irradiating of a sample with the charged particle beam; arithmetic processing units which generate an image of an irradiation area of the charged particle beam based on an output of the detectors; and a control unit which controls the lenses,
wherein the arithmetic processing units: form a first image, which is based on detection of first energy charged particles, based on the irradiation with a beam whose focus is adjusted on a sample surface side by the control unit; form a second image which is based on detection of second energy charged particles having a relatively higher energy than the first energy and a third image which is based on the detection of the first energy charged particles, based on the irradiation with a beam whose focus is adjusted on a bottom side of a pattern included in the sample by the control unit; weighted multiply inversion information obtained by inverting a brightness distribution of the third image to the second image; and compose the weighted multiplied second image with the first image.

* * * * *